United States Patent
Sugimoto et al.

(10) Patent No.: US 11,228,293 B2
(45) Date of Patent: Jan. 18, 2022

(54) DIFFERENTIAL AMPLIFIER CIRCUIT HAVING STABLE GAIN

(71) Applicant: SUMITOMO ELECTRIC INDUSTRIES, LTD., Osaka (JP)

(72) Inventors: Yoshiyuki Sugimoto, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 136 days.

(21) Appl. No.: 16/700,360

(22) Filed: Dec. 2, 2019

(65) Prior Publication Data
US 2020/0177143 A1 Jun. 4, 2020

(30) Foreign Application Priority Data
Dec. 3, 2018 (JP) .............................. JP2018-226637

(51) Int. Cl.
*H03F 1/30* (2006.01)
*H03F 3/45* (2006.01)
(Continued)

(52) U.S. Cl.
CPC ......... *H03F 3/45479* (2013.01); *G05F 1/573* (2013.01); *G05F 3/245* (2013.01);
(Continued)

(58) Field of Classification Search
CPC ...... H03F 3/45479; H03F 3/345; H03F 1/302; H03F 2203/45026; H03F 3/45632;
(Continued)

(56) References Cited

U.S. PATENT DOCUMENTS

| 7,489,195 B2* | 2/2009 | Lien ..................... H03F 3/45197 330/254 |
| 2003/0098744 A1 | 5/2003 | Banba |

(Continued)

FOREIGN PATENT DOCUMENTS

| JP | S58-204614 | 11/1983 |
| JP | S63-175510 | 7/1998 |

(Continued)

*Primary Examiner* — Jung Kim
(74) *Attorney, Agent, or Firm* — Smith, Gambrell & Russell, LLP.

(57) ABSTRACT

A differential amplifier circuit includes: a control current source supplying a control current; paired bipolar transistors; an a variable resistance circuit including: a series circuit of a first resistor and a second resistor having an identical resistance, the series circuit electrically connected between a first terminal and a second terminal of the variable resistance circuit; a first field effect transistor (FET) having a source and a drain being electrically connected to emitters of the paired bipolar transistors, respectively; and a second FET having a drain, a gate being electrically connected to the drain thereof, the gate of the first FET, and a control terminal of variable resistance circuit, a source being electrically connected to a connection node between the first resistor and the second resistor, wherein the control current source adjusts the control current to allow transconductance of the second FET to be kept constant.

4 Claims, 4 Drawing Sheets

(51) Int. Cl.
  *G05F 1/573*  (2006.01)
  *H03F 3/345*  (2006.01)
  *G05F 3/24*   (2006.01)

(52) U.S. Cl.
  CPC ............. *H03F 1/302* (2013.01); *H03F 3/345* (2013.01); *H03F 2200/447* (2013.01); *H03F 2203/45026* (2013.01)

(58) Field of Classification Search
  CPC ..... H03F 2203/45466; H03F 2200/447; H03F 3/50; H03F 2203/45612; H03F 3/45098; G05F 1/573; G05F 3/245; G05F 3/262; H03M 1/747
  See application file for complete search history.

(56) References Cited

U.S. PATENT DOCUMENTS

| | | |
|---|---|---|
| 2004/0178850 A1 | 9/2004 | Banba |
| 2004/0183599 A1 | 9/2004 | Banba et al. |
| 2005/0179494 A1 | 8/2005 | Banba |
| 2006/0183449 A1 | 8/2006 | Hori |

FOREIGN PATENT DOCUMENTS

| | | |
|---|---|---|
| JP | H11-509711 | 8/1999 |
| JP | 2003-168937 | 6/2003 |
| JP | 2003-168938 | 6/2003 |
| JP | 2003-243951 | 8/2003 |
| JP | 2004-266316 | 9/2004 |
| JP | 2004-304775 | 10/2004 |
| JP | 2011-205470 | 10/2011 |
| WO | 97/42704 | 11/1997 |

\* cited by examiner

DIFFERENTIAL AMPLIFIER CIRCUIT HAVING STABLE GAIN

TECHNICAL FIELD

The present disclosure relates to a differential amplifier circuit.

This application claims priority based on Japanese Patent Application No. 2018-226637 filed on Dec. 3, 2018, the content of which is incorporated by reference herein in its entirety.

BACKGROUND

With an increase in capacity of optical communication networks, it is desired to respond to multilevel signals such as 4-level pulse amplitude modulation (PAM4) of optical signals. For this reason, linear operations are required for differential amplifier circuits used in an optical front end (a conversion unit for performing conversion between an optical signal and an electrical signal) such as a laser driver and a transimpedance amplifier. In order that such differential amplifier circuits perform linear operation even when the intensity of an input signal varies, it is desirable that gains of the differential amplifier circuits can be appropriately adjusted to prevent non-linear operation due to the amplitude of an output signal being saturated.

Japanese Unexamined Patent Publication No. 2004-304775 discloses a variable gain differential amplifier including a pair of transistors, and a variable resistance circuit which is provided between emitters of the pair of transistors and which has a field effect transistor (FET), where in a differential input signal is input to bases of the pair of transistors. In this variable gain differential amplifier, a control voltage is applied to the gate of the FET, and gain control is performed by changing source-drain resistance of the FET according to the control voltage.

In the variable gain differential amplifier disclosed in Japanese Unexamined Patent Publication No. 2004-304775, a bias voltage is supplied to the base of each of the pair of transistors via a resistance element. Meanwhile, the base-emitter voltage of the transistor varies with temperature, and therefore, the drain potential and the source potential of the FET vary with temperature. For this reason, even if the control voltage applied to the gate of the FET is constant, the gate-source voltage of the FET varies with respect to a threshold voltage, so that the resistance of the variable resistance circuit varies, which may lead to variation in gain of the differential amplifier.

The present disclosure describes a differential amplifier circuit that can reduce the temperature dependence of gain.

SUMMARY

A differential amplifier circuit according to one aspect of the present disclosure includes: a first current source; a second current source; a control current source providing a control current; paired bipolar transistors having respective bases receiving a differential input signal, respective collectors generating a differential current signal, and respective emitters respectively connected to the first current source and the second current source; a load circuit converting the differential current signal to a differential output signal; and a variable resistance circuit having a control terminal, and a first terminal and a second terminal, the control terminal receiving the control current, the first terminal being electrically connected to one of the respective emitters, the second terminal being electrically connected to another of the respective emitters. The variable resistance circuit includes; a series circuit of a first resistor and a second resistor, the series circuit electrically connected between the first terminal and the second terminal, the series circuit including a connection node between the first resistor and the second resistor, the first resistor and the second resistor having an identical resistance: a first field effect transistor (FET) having a gate, a source, and a drain, the source being electrically connected to the one of the respective emitters, and the drain being electrically connected to the another of the respective emitters; and a second FET having a gate, a source, a drain, the gate thereof being electrically connected to the drain thereof, the gate of the first FET, and the control terminal, the source thereof being electrically connected to the connection node. The control current source adjusts the control current to allow transconductance of the second FET to be kept constant.

DETAILED DESCRIPTION

A specific example of the differential amplifier circuit according to the embodiment of the present disclosure will be described below with reference to the drawings. It should be noted that the present disclosure is not limited to the description below, and is intended to include all modifications within the spirit and scope as defined by the appended claims and their equivalents.

Figure 1:
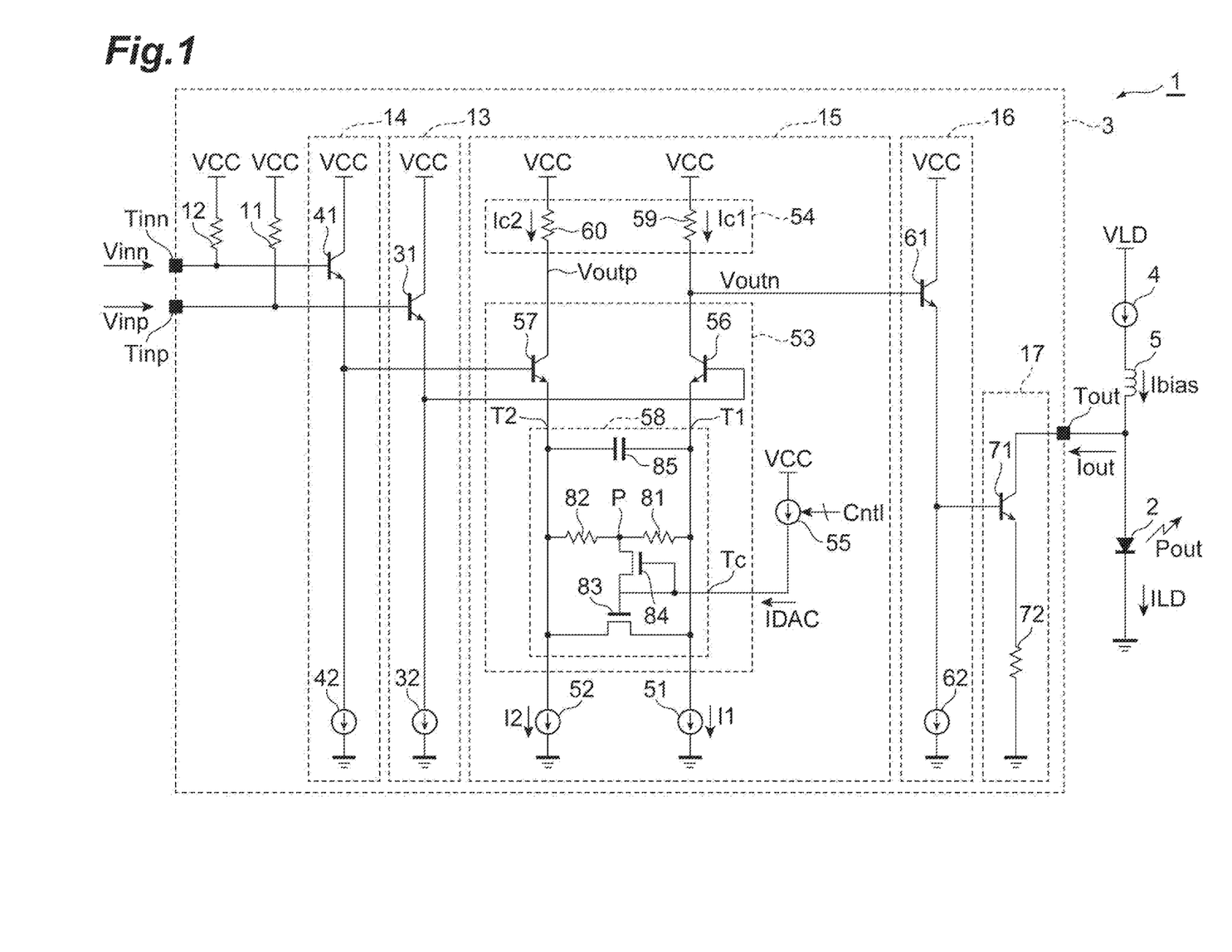
FIG. 1 is a diagram illustrating an example of a circuit configuration of an optical transmission device including a differential amplifier circuit according to an embodiment.

FIG. 1 is a diagram illustrating an example of a circuit configuration of an optical transmission device including the differential amplifier circuit according to the embodiment. As shown in FIG. 1, an optical transmission device 1 mainly includes a light emitting element 2 and a drive circuit 3. The light emitting element 2 is, for example, a semiconductor laser element for direct modulation, and specifically, an edge emitting laser diode. Examples of such a laser diode include a distributed feedback laser diode (DFB-LD) and a Fabry-Perot laser diode (FP-LD). Here, the direct modulation means a modulation method in which the intensity (optical power) of an optical output signal Pout output from the semiconductor laser element is changed by changing an amount of current flowing through the semiconductor laser element.

The anode of the light emitting element 2 is electrically connected to a power supply voltage VLD via an FBI (ferrite bead inductor) 5 and a bias current source 4. That is, the light emitting element 2 is connected to the bias current source 4 in series. Further, the anode of the light emitting element 2 is electrically connected to a terminal Tout of the drive circuit 3. A cathode of the light emitting element 2 is electrically connected to a ground (ground potential). That is, the light emitting element 2 operates with cathode grounding. When, for example, the light emitting element 2 is formed on one semiconductor chip and the drive circuit 3 is formed on another semiconductor chip, the anode of the light emitting element 2 and the terminal Tout of the drive circuit 3 may be connected to each other with a bonding wire (not illustrated). Similarly, the FBI 5 may be connected to the anode of the light emitting element 2 via a bonding wire (not illustrated). The bias current source 4 supplies a DC bias current Ibias for causing the light emitting element 2 to emit light with a predetermined intensity. For example, the time average value (average optical power) of the intensity of the optical output signal Pout generated by direct modulation is adjusted according to the bias current Ibias.

The drive circuit 3 is designed to perform direct modulation, and supplies a drive current ILD to the light emitting element 2 particularly on the basis of a shunt driving scheme. The drive circuit 3 directly modulates the light emitting element 2 by on-off keying. That is, the drive circuit 3 increases or decreases the optical output signal Pout by increasing or decreasing the drive current ILD according to a differential input signal input from the outside of the drive circuit 3. The differential input signal includes an input signal Vinp and an input signal Vinn. The input signal Vinp and the input signal Vinn are complementary signals. For example, the input signal Vinp has a phase different from the phase of the input signal Vinn by 180°. That is, the input signal Vinn decreases when the input signal Vinp increases, and the input signal Vinn increases when the input signal Vinp decreases. In a case where the differential input signal is a non-return to zero (NRZ) signal with two logic values of 0 level and 1 level, the input signal Vinn reaches 0 level (bottom level) when the input signal Vinp reaches 1 level (peak value), and the input signal Vinn reaches the peak value when the input signal Vinp reaches the bottom value. The amplitude of the input signal Vinp (the difference between the peak value and the bottom value) is substantially equal to the amplitude of the input signal Vinn. The drive circuit 3 has a terminal Tinp, a terminal Tinn, and the terminal Tout. The input signal Vinp is supplied to the terminal Tinp from the outside of the drive circuit 3. The input signal Vinn is supplied to the terminal Tinn from the outside of the drive circuit 3.

The drive circuit 3 generates an output current (shunt current) Iout according to the differential input signal (input signal Vinp and input signal Vinn) supplied to the terminal Tinp and the terminal Tinn. The output current Iout is a signal for increasing or decreasing the drive current ILD. The output current Iout is diverted from the bias current Ibias and flows into the drive circuit 3 through the terminal Tout. With such a configuration, the drive current ILD defined by the bias current source 4 and the drive circuit 3 is supplied to the light emitting element 2 through the anode of the light emitting element 2, and the light emitting element 2 outputs the optical output signal Pout according to the drive current ILD. For example, when the drive current ILD increases, the optical output signal Pout increases, and when the drive current ILD decreases, the optical output signal Pout decreases. When the bias current Ibias is maintained at a constant value, the drive current ILD decreases with an increase in the output current Iout, and the drive current ILD increases with a decrease in the output current Iout. Therefore, the drive current ILD is a signal obtained by inverting the output current Iout.

The configuration of the drive circuit 3 will be described in more detail. The drive circuit 3 includes a resistance element 11, a resistance element 12, an emitter follower circuit 13, an emitter follower circuit 14, a differential amplifier circuit 15, an emitter follower circuit 16, and a transconductance amplifier 17.

The resistance element 11 and the resistance element 12 are, for example, input termination resistors. One end of the resistance element 11 is electrically connected to the terminal Tinp, and the other end of the resistance element 11 is electrically connected to a power supply voltage VCC. One end of the resistance element 12 is electrically connected to the terminal Tinn, and the other end of the resistance element 12 is electrically connected to the power supply voltage VCC. Here, "being electrically connected to the power supply voltage VCC" means "being connected to a power supply line for supplying the power supply voltage VCC to each circuit in the drive circuit 3". The same applies to the following description.

The emitter follower circuit 13 receives the input signal Vinp and outputs the input signal Vinp to the differential amplifier circuit 15. The emitter follower circuit 13 includes a transistor 31 and a current source 32. The transistor 31 is, for example, an NPN transistor. The base of the transistor 31 is electrically connected to the terminal Tinp. The collector of the transistor 31 is electrically connected to the power supply voltage VCC. The emitter of the transistor 31 is electrically connected to one end of the current source 32. The current source 32 is a constant current source. The other end of the current source 32 is connected to the ground. The emitter of the transistor 31 outputs the level-shifted input signal Vinp to the differential amplifier circuit 15.

The emitter follower circuit 14 receives the input signal Vinn and outputs the input signal Vinn to the differential amplifier circuit 15. The emitter follower circuit 14 includes a transistor 41 and a current source 42. The transistor 41 is, for example, an NPN bipolar transistor. The base of the transistor 41 is electrically connected to the terminal Tinn. The collector of the transistor 41 is electrically connected to the power supply voltage VCC. The emitter of the transistor 41 is electrically connected to one end of the current source 42. The current source 42 is a constant current source. The other end of the current source 42 is connected to the ground. The emitter of the transistor 41 outputs the level-shifted input signal Vinn to the differential amplifier circuit 15.

The differential amplifier circuit 15 generates a differential output signal (an output signal Voutp and an output signal Voutn) by amplifying the differential input signal (the input signal Vinp and the input signal Vinn). The differential amplifier circuit 15 includes a current source 51 (first current source), a current source 52 (second current source), a differential circuit 53, a load circuit 54, and a control current source 55.

The current source 51 is a circuit that supplies a current I1 (first current). The current source 51 supplies the current I1 to the differential circuit 53. The current source 52 is a circuit that supplies a current I2 (second current). The current source 52 supplies the current I2 to the differential circuit 53. The current I1 and the current I2 may be set to have the same magnitude. The currents I1 and I2 are normally set to be constant with respect to time. However, when, for example, the differential amplifier circuit 15 performs temperature compensation operation with respect to a variation in temperature, the set values of the currents I1 and I2 may be changed as appropriate.

The differential circuit 53 generates a differential current signal (current signal Ic1 and current signal Ic2) by respectively distributing the current I1 and the current I2 to two lines in accordance with the input signal Vinp and the input signal Vinn. The differential circuit 53 includes a transistor 56 (first transistor), a transistor 57 (second transistor), and a variable resistance circuit 58. The sum of the current I1 and the current I2 is substantially equal to the sum of the current signal Ic1 and the current signal Ic2. The differential circuit 53 distributes the sum of the current I1 and the current I2 to two lines according to the difference between the input signal Vinp and the input signal Vinn to generate the current signal Ic1 and the current signal Ic2, respectively.

The transistors 56 and 57 are, for example, NPN bipolar transistors. The base of the transistor 56 is electrically connected to the emitter of the transistor 31. The input signal Vinp is input to the base of the transistor 56. The emitter of the transistor 56 is electrically connected to the current source 51. The collector of the transistor 56 is electrically connected to the load circuit 54 and outputs the current signal Ic1. The base of the transistor 57 is electrically connected to the emitter of the transistor 41. The input signal Vinn is input to the base of the transistor 57. The emitter of the transistor 57 is electrically connected to the current source 52. The collector of the transistor 57 is electrically connected to the load circuit 54 and outputs the current signal Ic2. That is, the base of the transistor 56 and the base of the transistor 57 receive the differential input signal. The collector of the transistor 56 and the collector of the transistor 57 output the differential current signal.

The variable resistance circuit 58 is provided between the emitter of the transistor 56 and the emitter of the transistor 57. The variable resistance circuit 58 adjusts the resistance between the emitter of the transistor 56 and the emitter of the transistor 57 (resistance of the variable resistance circuit 58). The variable resistance circuit 58 has a control terminal Tc, a terminal T1 (first terminal), and a terminal T2 (second terminal). The terminal T1 is electrically connected to the emitter of the transistor 56. The terminal T2 is electrically connected to the emitter of the transistor 57. A control current IDAC is supplied from the control current source 55 to the control terminal Tc. The variable resistance circuit 58 includes a resistance element 81 (first resistance element), a resistance element 82 (second resistance element), a field effect transistor (FET) 83 (first field effect transistor), a field effect transistor 84 (second field effect transistor), and a capacitor 85.

The resistance element 81 and the resistance element 82 are connected in series between the terminal T1 and the terminal T2. That is, one end of the resistance element 81 is electrically connected to the terminal T1, and is electrically connected to the emitter of the transistor 56 via the terminal T1. The other end of the resistance element 81 is electrically connected to one end of the resistance element 82, and a connection node P is formed. The other end of the resistance element 82 is electrically connected to the terminal T2, and is electrically connected to the emitter of the transistor 57 via the terminal T2. The resistance R1 of the resistance element 81 is set equal to the resistance R2 of the resistance element 82.

Each of the field effect transistors 83 and 84 has a gate, a source, and a drain. The source of the field effect transistor 83 is electrically connected to the terminal T1, and is electrically connected to the emitter of the transistor 56 via the terminal T1. The drain of the field effect transistor 83 is electrically connected to the terminal T2, and is electrically connected to the emitter of the transistor 57 via the terminal T2. Note that the source and the drain of the field effect transistor 83 are named only for being distinguished from each other for convenience, and the source and the drain may be interchanged and connected to the transistors 56 and 57, respectively. The gate of the field effect transistor 83, the gate of the field effect transistor 84, and the drain of the field effect transistor 84 are electrically connected in common to the control terminal Tc, and are electrically connected to an output terminal 55a (see FIG. 2) of the control current source 55 via the control terminal Tc. The source of the field effect transistor 84 is electrically connected to the connection node P between the resistance element 81 and the resistance element 82. That is, the field effect transistor 84 is diode-connected between the gate (control terminal Tc) of the field effect transistor 83 and the connection node P. The field effect transistor 83 functions as a variable resistor that can be adjusted by the control current IDAC. The on-resistance Ron of the field effect transistor 83 is not dependent on temperature. The detail of the on-resistance Ron will be described later.

The capacitor 85 is electrically connected between the terminal T1 and the terminal T2. That is, one end of the capacitor 85 is electrically connected to the terminal T1, and is electrically connected to the emitter of the transistor 56 via the terminal T1. The other end of the capacitor 85 is electrically connected to the terminal T2, and is electrically connected to the emitter of the transistor 57 via the terminal T2.

In the variable resistance circuit 58, the impedance between the emitter of the transistor 56 and the emitter of the transistor 57 is lowered at high frequency by the combined resistance of the resistance element 81, the resistance element 82, and the field effect transistor 83, and the capacitor 85, so that the gain of the differential circuit 53 can be increased. By appropriately designing the size of the field effect transistor 83, the resistance elements 81 and 82, and the capacitor 85, loss at high frequency can be compensated. Since the value of the combined resistance can be changed by a control signal Cntl, characteristics of compensation can also be adjusted.

The load circuit 54 converts the differential current signal (current signal Ic1 and current signal Ic2) into the differential output signal (output signal Voutp and output signal Voutn). The load circuit 54 includes a load resistance element 59 and a load resistance element 60. One end of the load resistance element 59 is electrically connected to the collector of the transistor 56. The other end of the load resistance element 59 is electrically connected to the power supply voltage VCC. The load resistance element 59 generates the output signal Voutn on the basis of the current signal Ic1. In the present embodiment, the load resistance element 59 converts the current signal Ic1 into the output signal Voutn. Specifically, the collector potential of the transistor 56 generated when the current signal Ic1 flows through the load resistance element 59 is output as the output signal Voutn.

One end of the load resistance element 60 is electrically connected to the collector of the transistor 57. The other end of the load resistance element 60 is electrically connected to the power supply voltage VCC. The load resistance element 60 generates the output signal Voutp on the basis of the current signal Ic2. In the present embodiment, the load resistance element 60 converts the current signal Ic2 into the output signal Voutp. Although the output signal Voutp and the output signal Voutn are generated by the load circuit 54, the output signal Voutp may be output from the differential amplifier circuit 15 in place of the output signal Voutn, because the light emitting element 2 is driven by a single drive current as described later. When the output signal Voutp is output, the logic of the signal is inverted from that when the output signal Voutn is output.

The control current source 55 supplies the control current IDAC. The control current source 55 supplies the control current IDAC so that the transconductance Gm2 of the field effect transistor 84 is constant when the control current IDAC is set so as to obtain a predetermined on-resistance Ron. The control current source 55 is implemented by a band gap circuit, for example. A specific circuit configuration of the control current source 55 will be described later.

The emitter follower circuit 16 receives the output signal Voutn and outputs the output signal Voutn to the transconductance amplifier 17. The emitter follower circuit 16 includes a transistor 61 and a current source 62. The transistor 61 is, for example, an NPN bipolar transistor. The base of the transistor 61 is electrically connected to the collector of the transistor 56. The collector of the transistor 61 is electrically connected to the power supply voltage VCC. The emitter of the transistor 61 is electrically connected to one end of the current source 62. The current source 62 is a constant current source. The other end of the current source 62 is connected to the ground.

The transconductance amplifier 17 generates an output current (shunt current) Iout according to the output signal Voutn. The transconductance amplifier 17 increases or decreases the drive current ILD by diverting the output current Iout from the bias current Ibias via the terminal Tout. The transconductance amplifier 17 includes a transistor 71 and a resistance element 72. The transistor 71 is, for example, an NPN bipolar transistor. The base of the transistor 71 is electrically connected to the emitter of the transistor 61. The output signal Voutn is input to the base of the transistor 71. The emitter of the transistor 71 is connected to the ground via the resistance element 72. That is, the transistor 71 and the resistance element 72 constitute a grounded emitter circuit. The collector of the transistor 71 is electrically connected to the terminal Tout, and is electrically connected to the anode of the light emitting element 2 via the terminal Tout.

Figure 2:
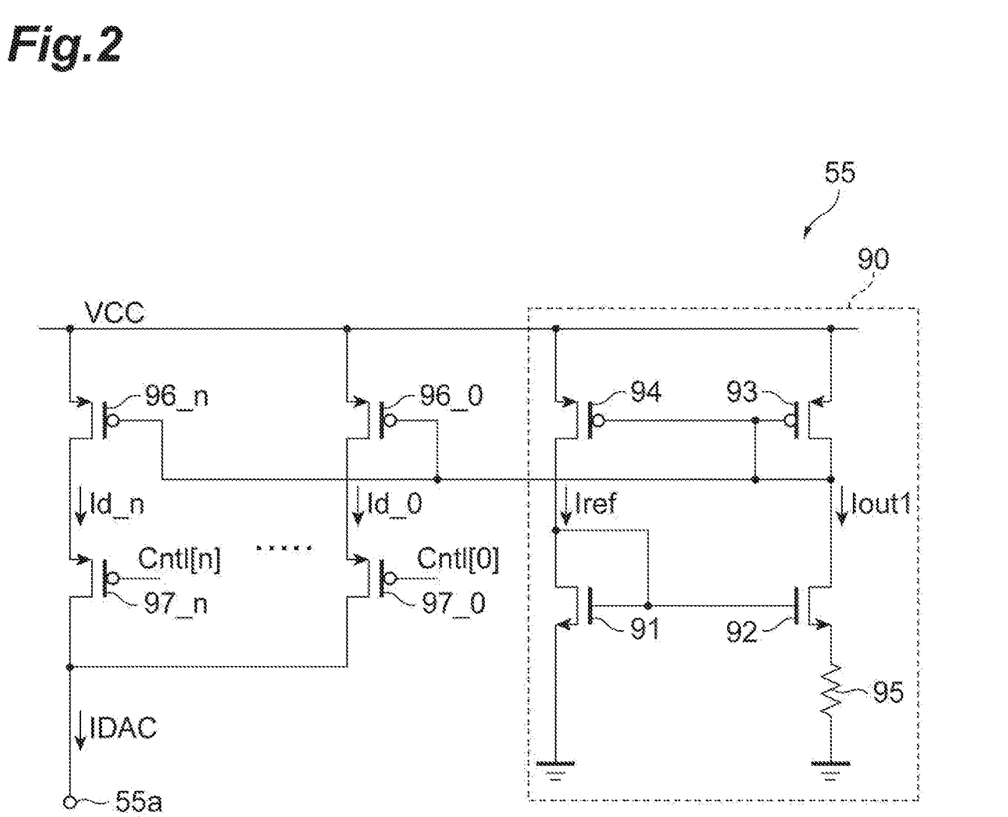
FIG. 2 is a diagram illustrating an example of a circuit configuration of a control current source illustrated in FIG. 1.

Next, an example of the circuit configuration of the control current source 55 will be described. FIG. 2 is a diagram illustrating an example of the circuit configuration of the control current source illustrated in FIG. 1. As shown in FIG. 2, the control current source 55 includes a stabilization circuit (compensation circuit) 90, n+1 output transistors 96_0 to 96_n, and n+1 transistors 97_0 to 97_n. The stabilization circuit 90 generates a stabilization current Iout1 (input current) that does not depend on the power supply voltage VCC. The stabilization circuit 90 includes a transistor 91 (third field effect transistor), a transistor 92 (fourth field effect transistor), a transistor 93, a transistor 94, and a resistance element 95 (third resistance element).

The transistors 91 and 92 are, for example, N-type metal-oxide-semiconductor field effect transistors (MOSFET). Each of the transistors 91 and 92 has a gate, a source, and a drain. The value (width-to-length (W/L) value) W2/L2 obtained by dividing the gate width (channel width) W2 of the transistor 92 by the gate length (channel length) L2 of the transistor 92 is set K (K is a real number larger than 1) times greater than the W/L value W1/L1 obtained by dividing the gate width W1 of the transistor 91 by the gate length L1 of the transistor 91. For example, a case where K=5 will be described. When the gate width W1 of the transistor 91 is 10 μm and the gate length L1 is 0.1 μm, the W/L value W1/L1 of the transistor 91 is 100. When the gate width W2 of the transistor 92 is 50 μm and the gate length L2 is 0.1 μm, the W/L value W2/L2 of the transistor 92 is 500, which is five times greater than the W/L value W1/L1 of the transistor 91. As described above, the gate length L2 may be equal to the gate length L1. The source of the transistor 91 is electrically connected to the ground. The source of the transistor 92 is connected to the ground via the resistance element 95. The resistance element 95 has a small temperature coefficient. The resistance element 95 has a resistance Rs. The gate of the transistor 91 is electrically connected to the drain of the transistor 91 and the gate of the transistor 92. The drain current of the transistor 91 serves as a reference current Iref (output current). The drain current of the transistor 92 serves as the stabilization current Iout1.

The transistors 93 and 94 are, for example, P-type MOSFETs. Each of the transistors 93 and 94 has a gate, a source, and a drain. The W/L value W3/L3 obtained by dividing the gate width W3 of the transistor 93 by the gate length L3 of the transistor 93 is set equal to the W/L value W4/L4 obtained by dividing the gate width W4 of the transistor 94 by the gate length L4 of the transistor 94. For example, when the gate width W3 of the transistor 93 is 20 μm and the gate length L3 is 0.1 μm, the W/L value W3/L3 of the transistor 93 is 200. When the gate width W4 of the transistor 94 is 20 μm and the gate length L4 is 0.1 μm, the W/L value W4/L4 of the transistor 94 is 200, which is the same as the W/L value W3/L3 of the transistor 93. As described above, the gate length L4 may be equal to the gate length L3. The gate and drain of the transistor 93 are electrically connected to each other, and are further electrically connected to the drain of the transistor 92 and the gate of the transistor 94. That is, the drain current of the transistor 93 is equal to the stabilization current Iout1. The drain of the transistor 94 is electrically connected to the gate and drain of the transistor 91. That is, the drain current of the transistor 94 is equal to the reference current Iref. The sources of the transistors 93 and 94 are electrically connected to the power supply voltage VCC.

The transistor 93 and the transistor 94 constitute a current mirror circuit. For example, a drain current (reference current Iref) having a magnitude proportional to the magnitude of the drain current (stabilization current Iout1) of the transistor 93 is output from the transistor 94. In the present embodiment, the magnitude of the reference current Iref is substantially equal to the magnitude of the stabilization current Iout1. That is, the current mirror circuit constituted by the transistor 93 and the transistor 94 outputs the reference current Iref having the same current value as the input stabilization current Iout1. The drain current of the transistor 92 is input as an input current to the current mirror circuit. The output current (reference current Iref) of the current mirror circuit is input to the drain of the transistor 91.

Here, in the stabilization circuit 90, the following Equation (1) is established between the gate-source voltage Vgs_M1 of the transistor 91 and the gate-source voltage Vgs_M2 of the transistor 92, using the resistance Rs of the resistance element 95.

[Equation 1]

$$Vgs\_M1 = Vgs\_M2 + Iout1 \times Rs \qquad (1)$$

Rewriting Equation (1) based on the square characteristics of the FET using the gate width W1, the gate length L1, the electron mobility $\mu_n$, and the capacitance $C_{ox}$ of the MOS capacitor of the transistor 91 yields Equation (2). Note that the electron mobility $\mu_n$ and the capacitance $C_{ox}$ of the MOS capacitor of the transistor 91 are set to be equal to the electron mobility $\mu_n$ and the capacitance $C_{ox}$ of the MOS capacitor of the transistor 92, respectively.

[Equation 2]

$$\sqrt{\frac{2 \times Iout1}{\mu_n \times C_{ox} \times \left(\frac{W1}{L1}\right)}} + Vth\_M1 = \sqrt{\frac{2 \times Iout1}{\mu_n \times C_{ox} \times K \times \left(\frac{W1}{L1}\right)}} + Vth\_M2 + Iout1 \times Rs \quad (2)$$

Assuming that the threshold voltage Vth_M1 is equal to the threshold voltage Vth-M2 in Equation (2), Equation (3) is obtained. The threshold voltages Vth_M1 and Vth_M2 are gate potentials at which the transistors 91 and 92 are switched from an off state to an on state with reference to the lower one of the drain voltage (drain potential) and the source voltage (source potential) of the transistors 91 and 92.

[Equation 3]

$$\sqrt{\frac{2 \times Iout1}{\mu_n \times C_{ox} \times \left(\frac{W1}{L1}\right)}} \times \left(1 - \frac{1}{\sqrt{K}}\right) = Iout1 \times Rs \quad (3)$$

When Equation (3) is rearranged for the stabilization current Iout1, Equation (4) is obtained. As shown in Equation (4), when the value of the power supply voltage VCC is set so that the transistors 91 to 94 operate in a saturation region, the stabilization current Iout1 assumes a value that does not depend on the value of the power supply voltage VCC.

[Equation 4]

$$Iout1 = \frac{2}{\mu_n \times C_{ox} \times \left(\frac{W1}{L1}\right)} \times \frac{1}{Rs^2} \times \left(1 - \frac{1}{\sqrt{K}}\right)^2 \quad (4)$$

On the other hand, when the transistor 91 is operating in the saturation region, the drain-source current Ids_M1 of the transistor 91 is expressed by Equation (5).

[Equation 5]

$$Ids\_M1 = \frac{1}{2} \times \mu_n \times C_{ox} \times \left(\frac{W1}{L1}\right) \times (Vgs\_M1 - Vth\_M1)^2 \quad (5)$$

Therefore, the transconductance Gm_M1 of the transistor 91 is expressed by Equation (6).

[Equation 6]

$$Gm\_M1 = \sqrt{2 \times \mu_n \times C_{ox} \times \left(\frac{W1}{L1}\right) \times Ids\_M1} \quad (6)$$

Since the drain-source current Ids_M1 of the transistor 91 is equal to the stabilization current Iout1, Equation (7) is obtained by substituting Equation (4) into Equation (6). As shown in Equation (7), the transconductance Gm_M1 related to the stabilization current Iout1 assumes a value that does not depend on the power supply voltage VCC and the MOS parameters (mobility $\mu_n$ and capacitance $C_{ox}$).

[Equation 7]

$$Gm\_M1 = \frac{2}{Rs} \times \left(1 - \frac{1}{\sqrt{K}}\right) \quad (7)$$

The n+1 output transistors 96_0 to 96_$n$ are, for example, P-type MOSFETs. The n+1 transistors 97_0 to 97_$n$ are, for example, P-type MOSFETs. The gates of the output transistors 96_0 to 96_$n$ are electrically connected to the gate and drain of the transistor 93. The sources of the output transistors 96_0 to 96_$n$ are electrically connected to the power supply voltage VCC. The drains of the output transistors 96_0 to 96_$n$ are electrically connected to the sources of the transistors 97_0 to 97_$n$, respectively. Control signals Cntl[0] to Cntl[n] are supplied to the gates of the transistors 97_0 to 97_$n$, respectively. The drains of the transistors 97_0 to 97_$n$ are electrically connected in common to the output terminal 55$a$ of the control current source 55.

The transistor 93 and each output transistor 96_$k$ (k is an integer of 0 to n) constitute a current mirror circuit. For example, an output current (drain current) Id_k having a magnitude proportional to the magnitude of the drain current (stabilization current Iout1) of the transistor 93 is output from the output transistor 96_$k$. In the present embodiment, the magnitude of each output current Id_k is substantially equal to the magnitude of the stabilization current Iout1.

The state of the transistor 97_$k$ is switched between an on state and an off state by the control signal Cntl[k]. The on state indicates a state in which the drain and the source are electrically conducted with a relatively small resistance (on resistance) of, for example, several tens of Ω or less. The off state indicates a state where the drain and the source are electrically disconnected by a high resistance. The voltage level of the control signal Cntl[k] is set to either a 0 level or a 1 level. The 0 level indicates a level at which the gate-source voltage is sufficiently smaller than the threshold voltage of the transistor 97_$k$ with reference to the source potential of the transistor 97_$k$. The 1 level indicates a level at which the gate-source voltage is sufficiently greater than the threshold voltage of the transistor 97_$k$ with reference to the source potential of the transistor 97_$k$. Therefore, when the control signal Cntl[k] of the 0 level is input, the transistor 97_$k$ is in an off state, and when the control signal Cntl[k] of the 1 level is input, the transistor 97_$k$ is in an on state. Accordingly, the individual transistors 97_$k$ function as electrical switches controlled by the respective control signals Cntl[k]. When the ground is considered as a reference, the voltage value of the control signal Cntl[k] of the 0 level is higher than the voltage value of the control signal Cntl[k] of the 1 level.

With such a configuration, in the control current source 55, the magnitude of the control current IDAC is controlled by the control signal Cntl[k]. Specifically, the control current IDAC having a magnitude obtained by multiplying the number of transistors 97 set to the on state by the control signal Cntl[k] in the transistors 97_0 to 97_$n$ and the magnitude of the stabilization current Iout1 is output from the output terminal 55$a$. In other words, the control current source 55 outputs a current x (x is a real number of 1 or more) times greater than the stabilization current Iout1 (reference current Iref) as the control current IDAC in response to the control signal Cntl[k].

Next, the fact that the on-resistance Ron of the field effect transistor 83 does not depend on temperature will be specifically described.

The field effect transistor 84 operates in the saturation region. Therefore, the drain-source current Ids2 of the field effect transistor 84 is expressed by Equation (8) using the gate-source voltage Vgs2 of the field effect transistor 84, the threshold voltage Vth2 of the field effect transistor 84, and the MOS parameters of the field effect transistor 84, as in Equation (5). The mobility $\mu_n$, the capacitance $C_{ox}$, and the W/L value W6/L6 of the field effect transistor 84 are set to be equal to the mobility $\mu_n$, the capacitance $C_{ox}$, and the W/L value W1/L1 of the transistor 91, respectively.

[Equation 8]

$$Ids2 = \frac{1}{2} \times \mu_n \times C_{ox} \times \left(\frac{W1}{L1}\right) \times (Vgs2 - Vth2)^2 \quad (8)$$

The drain-source current Ids2 is equal to the control current IDAC. In the following description, it is supposed that the control current IDAC is equal to x times the stabilization current Iout1 (that is, x transistors 97_k are in an on state and the remaining transistors 97_k are in an off state). In this case, the transconductance Gm2 of the field effect transistor 84 is expressed by Equation (9).

[Equation 9]

$$Gm2 = \sqrt{2 \times \mu_n \times C_{ox} \times \left(\frac{W1}{L1}\right) \times Ids2} \quad (9)$$

The drain-source current Ids2 is equal to the control current IDAC and is x times greater than the stabilization current Iout1. Therefore, when Equation (4) is multiplied by x, and substituted into Equation (9), Equation (10) is obtained. As shown in Equation (10), the transconductance Gm2 assumes a value that does not depend on the power supply voltage VCC and the MOS parameters (mobility $\mu_n$ and capacitance $C_{ox}$).

[Equation 10]

$$Gm2 = \frac{2 \times \sqrt{x}}{Rs} \times \left(1 - \frac{1}{\sqrt{K}}\right) \quad (10)$$

Equation (11) is obtained from Equation (4) and Equation (8).

[Equation 11]

$$\frac{1}{4} \times \mu_n^2 \times C_{ox}^2 \times \left(\frac{W1}{L1}\right)^2 \times (Vgs2 - Vth2)^2 = \frac{x}{Rs^2} \times \left(1 - \frac{1}{\sqrt{K}}\right)^2 \quad (11)$$

In the field effect transistor 83, the relationship among the gate-source voltage Vgs1, the threshold voltage Vth1, and the drain-source voltage Vds1 is 2×(Vgs1−Vth1)>>Vds1. That is, the field effect transistor 83 operates in a triode region (linear region). Therefore, the drain current Id1 of the field effect transistor 83 can be expressed by Equation (12). The mobility $\mu_n$, the capacitance $C_{ox}$, and the W/L value W5/L5 of the field effect transistor 83 are set equal to the mobility $\mu_n$, the capacitance $C_{ox}$, and the W/L value W6/L6 of the field effect transistor 84, respectively. That is, the W/L value W5/L5 is equal to the W/L value W1/L1. The threshold voltage Vth1 of the field effect transistor 83 is set equal to the threshold voltage Vth2 of the field effect transistor 84.

[Equation 12]

$$Id1 \approx \mu_n \times C_{ox} \times \frac{W1}{L1} \times (Vgs1 - Vth1) \times Vds1 \quad (12)$$

The gate-source voltage Vgs1 of the field effect transistor 83 is based on the lower one of the drain potential and the source potential of the field effect transistor 83. The gate-source voltage Vgs1 is expressed by Equation (13) using the gate-source voltage Vgs2, the control current IDAC, and the resistance R1 of the resistance element 81.

[Equation 13]

$$Vgs1 = Vgs2 - IDAC \times R1 \quad (13)$$

Here, since the gate-source voltage Vgs2 and the voltage drop in the resistance element 81 have the relationship of Vgs2>>IDAC×R1, the gate-source voltage Vgs1 can be expressed by Equation (14).

[Equation 14]

$$Vgs1 = Vgs2 \quad (14)$$

As shown in Equation (14), the field effect transistor 83 is biased with the gate-source voltage Vgs2. Therefore, the on-resistance Ron of the field effect transistor 83 can be expressed by Equation (15). As shown in Equation (15), the on-resistance Ron assumes a value that does not depend on the power supply voltage VCC and the MOS parameters (mobility $\mu_n$ and capacitance $C_{ox}$). Since the temperature coefficient of the resistance Rs is small, the on-resistance Ron hardly depends on the temperature.

[Equation 15]

$$Ron = \frac{Vds1}{Id1} = \frac{1}{\mu_n \times C_{ox} \times \frac{W1}{L1} \times (Vgs1 - Vth1)} = \frac{Rs}{2} \times \frac{1}{1 - \frac{1}{\sqrt{K}}} \times \frac{1}{\sqrt{x}} \quad (15)$$

Figure 3:
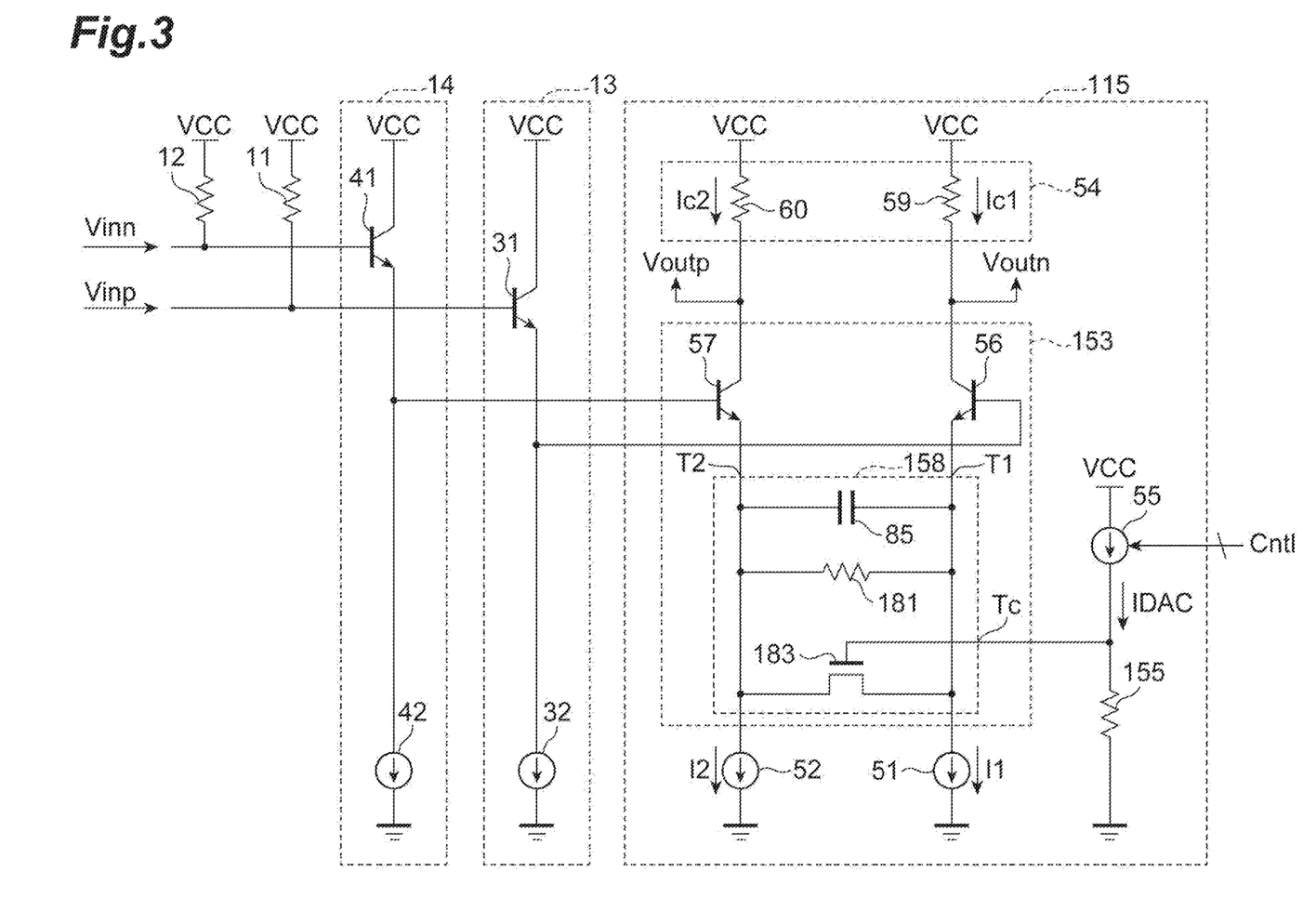
FIG. 3 is a diagram illustrating a circuit configuration of a differential amplifier circuit according to a comparative example.

Next, the effects of the differential amplifier circuit 15 will be described in comparison with a differential amplifier circuit according to a comparative example. FIG. 3 is a diagram illustrating a circuit configuration of the differential amplifier circuit according to the comparative example. The differential amplifier circuit 115 shown in FIG. 3 is mainly different from the differential amplifier circuit 15 in that the differential amplifier circuit 115 includes a differential circuit 153 instead of the differential circuit 53 and further includes a resistance element 155.

The differential circuit 153 is mainly different from the differential circuit 53 in that the differential circuit 153 includes a variable resistance circuit 158 instead of the variable resistance circuit 58. The variable resistance circuit 158 is mainly different from the variable resistance circuit 58 in that the variable resistance circuit 158 includes a single resistance element 181 instead of the resistance element 81 and the resistance element 82 connected in series, and includes a field effect transistor 183 instead of the field effect transistor 83 and the field effect transistor 84. Similar to the field effect transistor 83, the source of the field effect transistor 183 is electrically connected to the terminal T1, and the drain of the field effect transistor 183 is electrically connected to the terminal T2.

In the differential amplifier circuit 115, a control current source 55 and the resistance element 155 are connected in series. One end of the resistance element 155 is electrically connected to the output terminal 55a (see FIG. 2) of the control current source 55, and is electrically connected to the gate of the field effect transistor 183 via the control terminal Tc. The other end of the resistance element 155 is connected to the ground. The resistance element 155 has a resistance Rref. In the differential amplifier circuit 115, the control current IDAC flows through the resistance element 155, so that a potential of IDAC×Rref is generated at the gate of the field effect transistor 183. That is, the gate potential of the field effect transistor 183 is adjusted by changing the magnitude of the control current IDAC according to the control signal Cntl.

The source potential Vs11 and the drain potential Vd11 of the field effect transistor 183 are expressed by Equation (16) using the base-emitter voltage Vbe_Q1 of the transistor 31 and the base-emitter voltage Vbe_Q3 of the transistor 56. Note that the base-emitter voltage Vbe_Q2 of the transistor 41 is equal to the base-emitter voltage Vbe_Q1, and the base-emitter voltage Vbe_Q4 of the transistor 57 is equal to the base-emitter voltage Vbe_Q3.

[Equation 16]

$$Vs11=Vd11=VCC-(Vbe\_Q1+Vbe\_Q3) \quad (16)$$

Therefore, the gate-source voltage Vgs11 of the field effect transistor 183 is expressed by Equation (17). As shown in Equation (17), the gate-source voltage Vgs11 is determined by the base-emitter voltage Vbe_Q1 and the base-emitter voltage Vbe_Q3. The base-emitter voltage Vbe_Q1, the base-emitter voltage Vbe_Q2, the base-emitter voltage Vbe_Q3, and the base-emitter voltage Vbe_Q4 depend on temperature, and therefore, the gate-source voltage Vgs11 (source potential Vs11 and drain potential Vd11) depends on temperature.

[Equation 17]

$$Vgs11=IDAC \times Rref-VCC+(Vbe\_Q1+Vbe\_Q3) \quad (17)$$

Due to the temperature dependence of the field effect transistor 183 itself as well as the temperature dependence of the gate-source voltage Vgs11, the on-resistance of the field effect transistor 183 varies with temperature. As a result, the (low frequency) gain and frequency characteristics of the differential amplifier circuit 115 vary with temperature. For example, when the control of the field effect transistor 183 is not feedback control, a characteristic variation due to temperature is not compensated, which may arise problems such as deterioration of transmission characteristics.

On the other hand, in the differential amplifier circuit 15, the base of the transistor 56 and the base of the transistor 57 included in the differential circuit 53 receive the differential input signal (input signals Vinp and Vinn), the collector of the transistor 56 and the collector of the transistor 57 output the differential current signal (current signals Ic1 and Ic2), and the load circuit 54 converts the differential current signal into the differential output signal (output signals Voutp and Voutn). The emitter potential of the transistor 56 and the emitter potential of the transistor 57 are inverted from each other, and vary according to the differential input signal. The resistance element 81 and the resistance element 82 having the same resistance are connected in series between the emitter of the transistor 56 and the emitter of the transistor 57. Therefore, the potential at the connection node P between the resistance element 81 and the resistance element 82 can be an intermediate voltage (average potential) between the emitter potential of the transistor 56 and the emitter potential of the transistor 57.

The source and drain of the field effect transistor 83 are electrically connected to the emitter of the transistor 56 and the emitter of the transistor 57, respectively, and the source of the field effect transistor 84 is electrically connected to the connection node P. The gate of the field effect transistor 83 and the gate and drain of the field effect transistor 84 are commonly connected to the control terminal Tc that receives the control current IDAC. That is, the field effect transistor 84 is diode-connected between the gate of the field effect transistor 83 and the connection node P. With this configuration, the gate-source voltage Vgs1 of the field effect transistor 83 becomes substantially equal to the gate-source voltage Vgs2 of the field effect transistor 84, as represented by Equations (13) and (14). In other words, the reference voltage applied to the gate of the field effect transistor 83 is at the midpoint between the drain potential and the source potential of the field effect transistor 83. As a result, the temperature dependence of the gate-source voltage Vgs1 can be reduced.

As shown in Equation (15), the on-resistance Ron of the field effect transistor 83 is determined by a value obtained by subtracting the threshold voltage Vth1 from the gate-source voltage Vgs1, the mobility $\mu_n$, the capacitance $C_{ox}$, and the like. These values are temperature dependent. However, the control current IDAC is supplied so that the transconductance Gm2 of the field effect transistor 84 is constant when the control current IDAC is set so as to obtain a predetermined on-resistance Ron. Therefore, the product of the value obtained by subtracting the threshold voltage Vth1 from the gate-source voltage Vgs1, the mobility $\mu_n$, the capacitance $C_{ox}$, and the like becomes substantially constant regardless of temperature. From the above, the temperature dependence of the on-resistance Ron of the field effect transistor 83 is reduced. As a result, the temperature dependence of the gain of the differential amplifier circuit 15 can be reduced.

The variable resistance circuit 58 includes the capacitor 85 connected between the terminal T1 and the terminal T2. Therefore, when the frequency of the differential input signal is high, the resistance of the variable resistance circuit 58 is lowered, whereby the gain of the differential amplifier circuit 15 can be increased. As a result, the frequency characteristics of the differential amplifier circuit 15 can be compensated.

Figure 4:
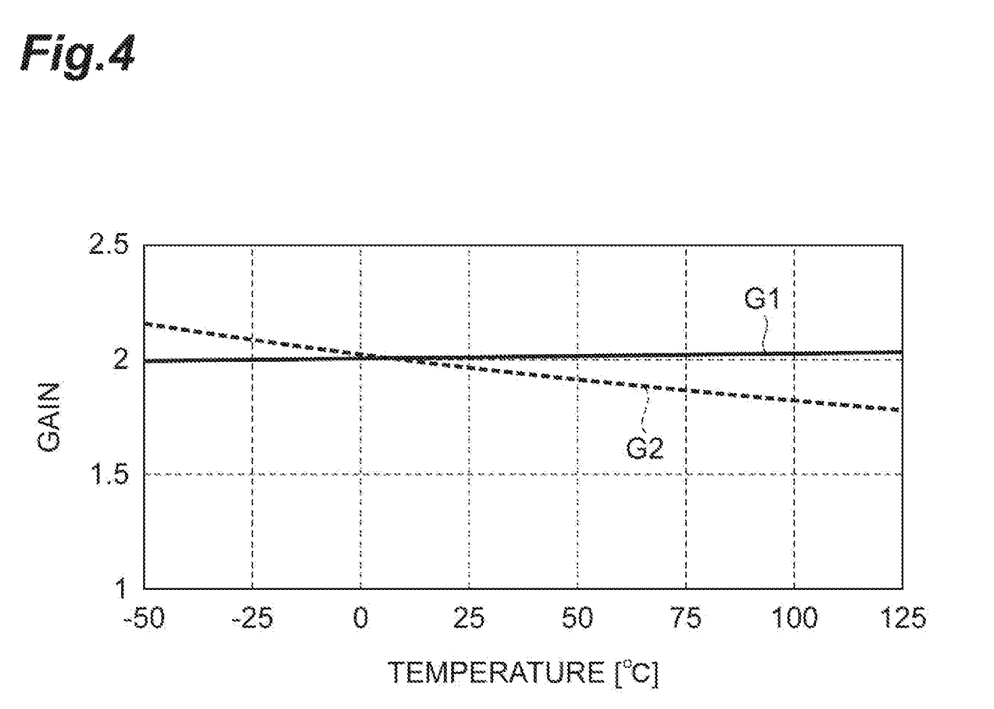
FIG. 4 is a diagram illustrating temperature characteristics of gain.

FIG. 4 is a diagram illustrating temperature characteristics of gain. The horizontal axis of FIG. 4 represents temperature, and the vertical axis of FIG. 4 represents the gain of the differential amplifier circuit. A graph G1 shows the temperature characteristic of the gain of the differential amplifier circuit 15. A graph G2 shows the temperature characteristic of the gain of the differential amplifier circuit 115. Here, the gain means (Voutp−Voutn)/(Vinp−Vinn). The resistances of the load resistance element 59 and the load resistance element 60 are set to 80Ω, the current I1 and the current I2 are set to 4 mA, and the power supply voltage VCC is set to 2.5V. The gate-source voltages Vgs1 and Vgs2 are set to about 1V, and the threshold voltages Vth1 and Vth2 are set to about 640 mV. The maximum value of the control current IDAC is set to about 200 µA (1/40 of the current I1+current I2). The resistance R1 of the resistance element 81 and the resistance R2 of the resistance element 82 are set to 37.5Ω, and the resistance of the resistance element 181 is set to 75Ω. The on-resistance Ron is set to 200Ω when the control current IDAC is 53 µA. The resistance Rref of the resistance element 155 is set to 100 KΩ when the control current IDAC is 18 µA. It can be confirmed from FIG. 4 that the gain of the differential amplifier circuit 115 decreases as the temperature increases, whereas the gain of the differential amplifier circuit 15 is substantially constant regardless of temperature variations.

Note that the differential amplifier circuit according to the present disclosure is not limited to the above embodiment.

For example, the differential amplifier circuit 15 is applicable to an optical reception device as well as the optical transmission device 1.

The variable resistance circuit 58 may not include the capacitor 85.

The field effect transistor 83, the field effect transistor 84, the transistor 91, and the transistor 92 have the same electron mobility $\mu_n$ and the same capacitance $C_{ox}$. Therefore, the field effect transistor 83, the field effect transistor 84, the transistor 91, and the transistor 92 may be formed on the same semiconductor chip.

What is claimed is:

1. A differential amplifier circuit comprising:
   a first current source;
   a second current source;
   a control current source providing a control current;
   paired bipolar transistors having respective bases receiving a differential input signal, respective collectors generating a differential current signal, and respective emitters respectively connected to the first current source and the second current source;
   a load circuit converting the differential current signal to a differential output signal; and
   a variable resistance circuit having a control terminal, and a first terminal and a second terminal, the control terminal receiving the control current, the first terminal being electrically connected to one of the respective emitters, and the second terminal being electrically connected to another of the respective emitters, the variable resistance circuit including:
   a series circuit of a first resistor and a second resistor, the series circuit being electrically connected between the first terminal and the second terminal, the series circuit including a connection node between the first resistor and the second resistor, the first resistor and the second resistor having an identical resistance;
   a first field effect transistor (FET) having a gate, a source, and a drain, the source being electrically connected to the one of the respective emitters, and the drain being electrically connected to the another of the respective emitters; and
   a second FET having a gate, a source, a drain, the gate thereof being electrically connected to the drain thereof, the gate of the first FET, and the control terminal, and the source thereof being electrically connected to the connection node;
   wherein the control current source adjusts the control current to allow transconductance of the second FET to be kept constant.

2. The differential amplifier circuit according to claim 1, wherein the control current source includes:
   a third resistor;
   a current mirror circuit generating an output current having a current value identical to a current value of an input current;
   a third FET having a gate, a source, and a drain, the source thereof being electrically connected to ground, the drain thereof receiving the output current; and
   a fourth FET having a gate, a source, and drain, the gate thereof being electrically connected to the gate of the third FET and the drain of the third FET, the source thereof being electrically connected to ground through the third resistor, the drain thereof providing the input current;
   wherein the fourth FET has a width-to-length (W/L) value equal to a W/L value of the third FET multiplied by K, where K is a real number greater than one,
   wherein the first FET and the second FET have a W/L value equal to a W/L value of the third FET, and
   wherein the control current source sets a value of the control current to be equal to a value of the output current multiplied by X, where X is real number greater than one.

3. The differential amplifier circuit according to claim 2, wherein the first FET, the second FET, the third FET, and the fourth FET are formed on a semiconductor chip, and have at least an identical electron mobility and an identical parasitic capacitance.

4. The differential amplifier circuit according to claim 1, wherein the variable resistance circuit further includes a capacitor electrically connected between the first terminal and the second terminal.

* * * * *